United States Patent
Im et al.

(10) Patent No.: US 9,431,272 B2
(45) Date of Patent: Aug. 30, 2016

(54) PRINTED CIRCUIT BOARD INCLUDING THROUGH REGION AND SEMICONDUCTOR PACKAGE FORMED BY USING THE SAME

(71) Applicant: Samsung Electronics Co., Ltd., Suwon-Si, Gyeonggi-Do (KR)

(72) Inventors: Chae-hun Im, Hwaseong-si (KR); Sang-uk Han, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 227 days.

(21) Appl. No.: 14/223,240

(22) Filed: Mar. 24, 2014

(65) Prior Publication Data

US 2014/0301055 A1  Oct. 9, 2014

(30) Foreign Application Priority Data

Apr. 9, 2013 (KR) .................. 10-2013-0038844

(51) Int. Cl.
*H05K 7/10* (2006.01)
*H01L 21/56* (2006.01)
*H01L 23/31* (2006.01)

(52) U.S. Cl.
CPC ........... *H01L 21/561* (2013.01); *H01L 21/565* (2013.01); *H01L 23/3128* (2013.01); *H01L 2224/16225* (2013.01); *H01L 2924/15311* (2013.01)

(58) Field of Classification Search
CPC .............. H01L 21/561; H01L 21/565; H01L 2224/16225; H01L 23/3128; H01L 2924/15311
USPC .................. 361/767, 760, 764; 174/254, 260
See application file for complete search history.

(56) References Cited

U.S. PATENT DOCUMENTS

| | | | |
|---|---|---|---|
| 4,768,195 A * | 8/1988 | Stoner ................ | G01R 31/2851 324/73.1 |
| 5,708,300 A | 1/1998 | Woosley et al. | |
| 6,462,427 B2 * | 10/2002 | Sakiyama ........... | H01L 25/0652 257/723 |
| 6,514,797 B2 | 2/2003 | Chee et al. | |
| 2011/0193228 A1* | 8/2011 | Yu ........................ | H01L 21/563 257/738 |
| 2011/0195543 A1 | 8/2011 | Jadhav et al. | |
| 2012/0178220 A1 | 7/2012 | Okada et al. | |
| 2014/0131886 A1* | 5/2014 | Paek ....................... | H01L 24/11 257/774 |

FOREIGN PATENT DOCUMENTS

| | | |
|---|---|---|
| JP | 2007305859 A | 11/2007 |
| JP | 2010092982 A | 4/2010 |
| JP | 2010192541 A | 9/2010 |

(Continued)

*Primary Examiner* — Yuriy Semenenko
(74) *Attorney, Agent, or Firm* — Harness, Dickey & Pierce, P.L.C.

(57) ABSTRACT

Provided is a printed circuit board (PCB). The PCB includes a board body that includes a first surface and a second surface opposite the first surface, a semiconductor chip mounting region that is disposed on the first surface of the board body, and includes a plurality of semiconductor chip mounting parts on which a semiconductor chip may be mounted, a through region that is disposed at a peripheral portion of the semiconductor chip mounting region, and includes a plurality of through holes passing through the board body, and an external terminal forming region that is disposed on the second surface of the board body, wherein a plurality of external terminal forming parts are disposed at the external terminal forming region in correspondence with the respective semiconductor chip mounting parts.

20 Claims, 9 Drawing Sheets

(56) References Cited

FOREIGN PATENT DOCUMENTS

| JP | 2010212628 | * | 9/2010 |
|----|------------|---|--------|
| JP | 2010212628 | A | 9/2010 |
| KR | 100600171  | B1 | 7/2006 |
| KR | 20090085254 | A | 8/2009 |
| KR | 101072507  | A | 2/2011 |
| KR | 20120032764 | A | 4/2012 |
| KR | 101173092  | B1 | 8/2012 |

* cited by examiner

PRINTED CIRCUIT BOARD INCLUDING THROUGH REGION AND SEMICONDUCTOR PACKAGE FORMED BY USING THE SAME

CROSS-REFERENCE TO RELATED PATENT APPLICATION

This application claims priority under 35 U.S.C. §119 to Korean Patent Application No. 10-2013-0038844, filed on Apr. 9, 2013, in the Korean Intellectual Property Office, the disclosure of which is incorporated herein in its entirety by reference.

BACKGROUND

1. Field

Some example embodiments of the present invention relate to printed circuit boards (PCBs) and/or semiconductor packages formed by using the same, and/or more particularly, to PCBs including a through region and a semiconductor package formed by using the same.

2. Description of the Related Art

A PCB may be used as an interconnection board for reducing a size of a semiconductor package, and a bump may be used as a connection terminal that connects the PCB and a semiconductor chip. When the bump is used as the connection terminal, a space between the semiconductor chip and the PCB may be filled with an encapsulant and a void can be formed in the encapsulant.

SUMMARY

Some example embodiments of the present invention provide printed circuit boards (PCBs), which is capable of reducing or prevent a void from being formed in an encapsulant.

Some example embodiments of the present invention also provide semiconductor packages formed by using the PCB.

According to example embodiments of the present invention, a PCB may include a board body having a first surface and a second surface opposite to the first surface, a semiconductor chip mounting region disposed on the first surface of the board body, and including a plurality of semiconductor chip mounting parts on which a semiconductor chip is to be mounted, a through region at a peripheral portion of the semiconductor chip mounting region, which includes a plurality of through holes passing through the board body, and an external terminal forming region on the second surface of the board body, which includes a plurality of external terminal forming parts provided corresponding to the respective semiconductor chip mounting parts.

The PCB may further include a first connection pad at a central portion and at least one peripheral portion adjacent to the central portion of each of the semiconductor chip mounting parts, and the first connection pad may be configured to mount the semiconductor chip thereon.

The first connection pad may include a plurality of first ball land patterns, which are separated from each other and provided over a substantially entire portion of each of the semiconductor chip mounting parts disposed at the first surface of the board body.

The through region may be at at least one outermost portion of the board body.

The through region may be provided at the outermost portion of the board body opposite to an encapsulant injecting port.

The through region may include a plurality of through holes, which are separated from each other and have at least one of a circular shape and a polygonal shape.

The PCB may further include a second connection pad at a central portion and at least one peripheral portion adjacent to the central portion of each of the external terminal forming parts, and the second connection pad may be configured to be electrically connected to the semiconductor chip.

The second connection pad may include a plurality of second ball land patterns, which are separated from each other and arranged over a substantially entire portion of each of the external terminal forming parts disposed at the second surface of the board body.

The PCB may further include a display region that is disposed on the first surface of the board body and between the semiconductor chip mounting region and the through region. The display region may be configured to display a quality status (e.g., good or no good) of the semiconductor chips.

The through region may be disposed at an outermost portion of the board body outward from the display region.

According to example embodiments of the present invention, a semiconductor package may include a board body of a PCB including a first surface and a second surface opposite the first surface, a first connection pad at a central portion and at least one peripheral portion adjacent to the central portion of a semiconductor chip mounting part, which is disposed on the first surface of the board body and configured to mount a semiconductor chip thereon, an encapsulating layer sealing the first surface of the board body and the semiconductor chip, a second connection pad at a central portion and at least one peripheral portion adjacent to the central portion of an external terminal forming part disposed on the second surface of the board body, and an external connection terminal at the second connection pad.

The semiconductor chip may be a flip chip.

The first connection pad may include a plurality of first ball land patterns, which are separated from each other and arranged all over a substantially entire portion of the semiconductor chip mounting part disposed at the first surface of the board body.

The second connection pad may include a plurality of second ball land patterns, which are separated from each other and arranged over a substantially entire portion of the external terminal forming part disposed at the second surface of the board body.

The semiconductor chip and the first connection pad may be connected by a bump, and the external connection terminal may be a solder ball.

According to example embodiments, a printed circuit board (PCB) may include a board body including a top surface and a bottom surface, a semiconductor chip mounting region on the top surface of the board body, the semiconductor chip mounting region including a plurality of semiconductor chip mounting parts configured to mount semiconductor chips thereon, a through region at a peripheral portion of the semiconductor chip mounting region and including a plurality of through holes passing through the board body, and an external terminal forming region on the bottom surface of the board body, the external terminal forming region including a plurality of external terminal forming parts, the external terminal forming parts corresponding to the respective semiconductor chip mounting parts.

The through region may be at least one outermost portion of the board body.

The through region may be opposite to an encapsulant injecting port.

The through region may be in a first direction, the first direction being perpendicular to a second direction defined between a display region configured to display a quality status of the semiconductor chip and an encapsulant injection port.

The through region may not be on the semiconductor chip mounting parts and the external terminal forming parts such that a plurality of first ball land patterns are over a substantially entire portion of each of the semiconductor chip mounting parts and a plurality of second ball land patterns are over a substantially entire portion of each of the external terminal forming parts.

BRIEF DESCRIPTION OF THE DRAWINGS

The above and other features and advantages of the present invention will become more apparent by describing in detail example embodiments thereof with reference to the attached drawings in which.

DETAILED DESCRIPTION

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of,"

when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
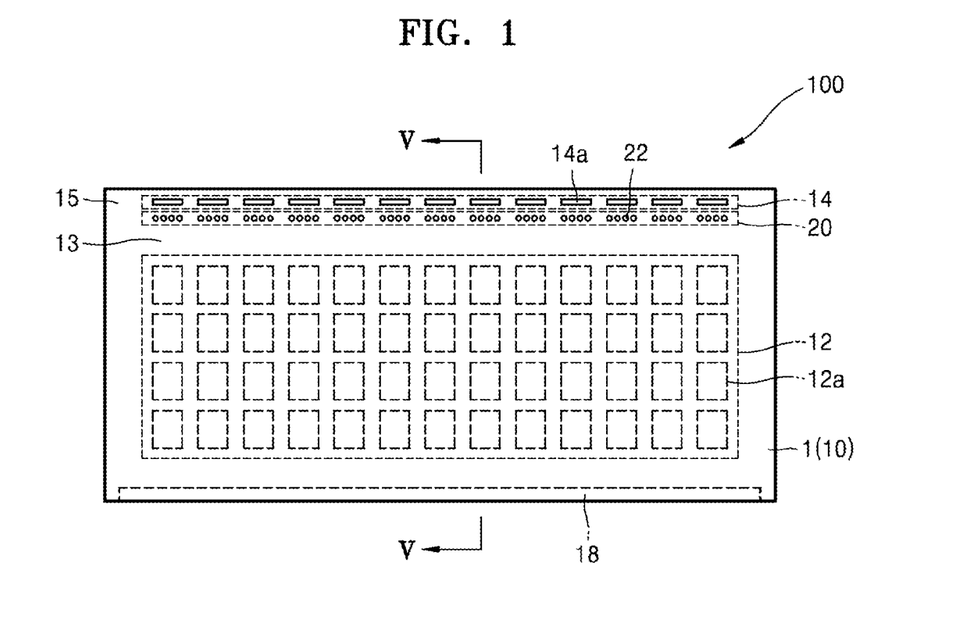
FIG. 1 is an upper plan view of a printed circuit board (PCB) according to example embodiments of the present invention.
Figure 2:
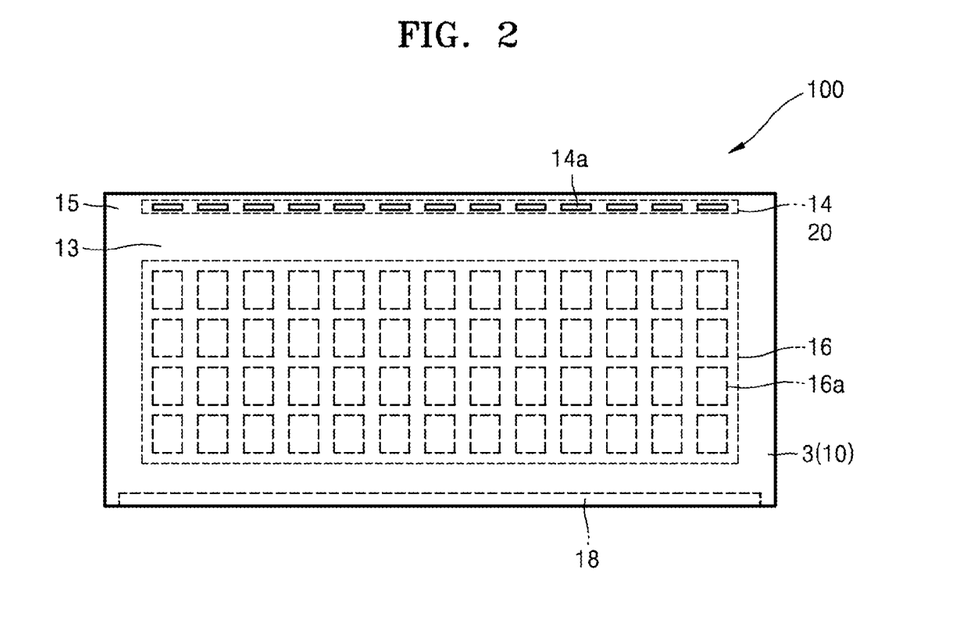
FIG. 2 is a lower plan view of the PCB of FIG. 1.

FIG. 1 is an upper plan view of a printed circuit board (PCB) according to example embodiments of the present invention. FIG. 2 is a lower plan view of the PCB of FIG. 1.

For example, a PCB 100 may include a board body 10 that includes a first surface 1 and a second surface 3 opposite thereto. The first surface 1 may be a top surface, and the second surface 3 may be a bottom surface. An internal metal interconnection (not shown) for connecting connection pads (24 of FIGS. 3 and 26 of FIG. 6), respectively formed on the first and second surfaces 1 and 3, may be formed in the board body 10.

The board body 10 may be formed of a photosensitive liquid dielectric, a photosensitive dry-film dielectric, a polyimide flexible film, a thermally cured dry films, a thermally cured liquid dielectric, a resin coated copper foil (RCC), a thermoplastic, or a flexible resin. The board body 10 may be formed of ceramic. The listed materials of the board body 10 are merely examples, and example embodiments are not limited thereto.

A semiconductor chip mounting region 12, which includes a plurality of semiconductor chip mounting parts 12a mounting semiconductor chips (not shown) thereon, may be formed on the first surface 1 of the board body 10. The semiconductor chip mounting region 12 may be formed at a central portion of the board body 10. A through hole for facilitating flow of an encapsulant in a process of molding semiconductor chips mounted on the PCB 100 may not be formed in the semiconductor chip mounting parts 12a as described below.

A through region 14, which includes a plurality of through holes 14a passing through the board body 10, may be formed at a peripheral portion 13 outside the semiconductor chip mounting region 12. The peripheral portion 13 may denote a portion, other than a portion in which the semiconductor chip mounting region 12 is formed, in the first surface 1 of the board body 10.

The through region 14 may be installed in at least one outermost portion 15 of the board body 10. The outermost portion 15 may be disposed in the peripheral portion 13, and may denote a portion adjacent to a corner of the first surface 1 of the board body 10. The through region 14 may be installed at the outermost portion 15 of the board body 10, which is opposite to an encapsulant injecting port 18. The encapsulant injecting port 18 may be an injecting port through which an encapsulant (or a molding material) is injected in the process of molding the semiconductor chips mounted on the PCB 100.

The through region 14 may include a plurality of through holes 14a separated from each other. The through holes 14a may be formed in a polygonal shape, e.g., a triangular shape, a tetragonal shape, a diamond shape, or a circular shape. Various examples of the through holes 14a will be described below. The through region 14, as described below, may be a region provided to reduce or prevent a void from being formed in an encapsulating layer by facilitating flow of the encapsulant in the process of molding the semiconductor chips mounted on the PCB 100.

The PCB 100 may further include a display region 20 configured to display fair and poor quality status of semiconductor chips, on the first surface 1 of the board body 10. The display region 20 may be provided between the semiconductor chip mounting region 12 and the through region 14. The display region 20 may include a plurality of display patterns separated from each other. The through region 14 may be formed at the outermost portion 15 of the board body 10 outward from the display region 20.

The display region 20 may be a region which, when semiconductor chips are mounted on the PCB 100, displays the quality status of the semiconductor chips. The display region 20 may be a region which is used to display the quality status of semiconductor chips based on a result of inspection by a vision camera in a marking process of a semiconductor package manufacturing process.

An external terminal forming region 16 including a plurality of external terminal forming parts 16a may be formed on the second surface 3 of the board body 10 in correspondence with the semiconductor chip mounting parts 12a. The encapsulant injecting port 18, as described above, may also be disposed at one side of the external terminal forming region 16.

Figure 3:
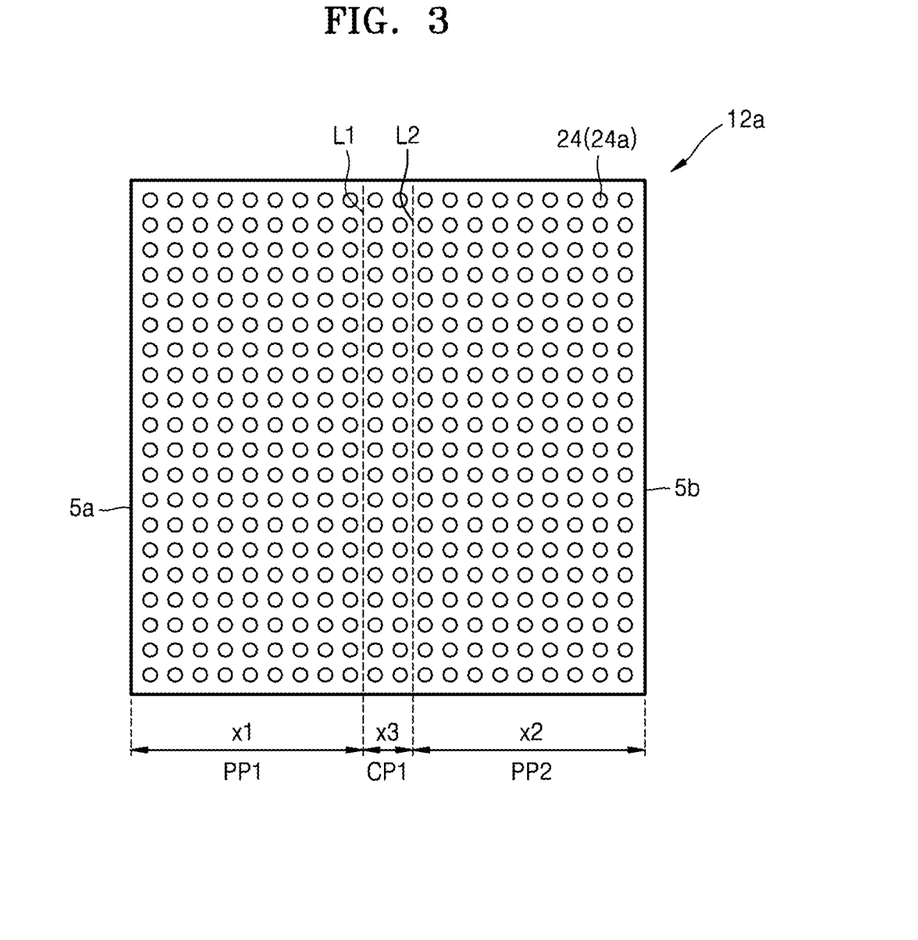
FIG. 3 is an upper plan view of a semiconductor chip mounting part included in a semiconductor chip mounting region of the PCB of FIG. 1.

FIG. 3 is an upper plan view of the semiconductor chip mounting part included in the semiconductor chip mounting region of the PCB 100 of FIG. 1.

FIG. 3 is an upper plan view which enlarges and illustrates one of the semiconductor chip mounting parts 12a of FIG. 1. A first connection pad 24 to be connected to a semiconductor chip (not shown) may be disposed at the semiconductor chip mounting part 12a. The first connection pad 24 may be disposed at a central portion CP1 and peripheral portions PP1 and PP2 provided near the central portion CP1 of the semiconductor chip mounting part 12a.

The first peripheral portion PP1 of the semiconductor chip mounting part 12a may be a portion from one corner 5a to a first division line L1 that is disposed at a width or distance of X1 from the corner 5a. The second peripheral portion PP2 of the semiconductor chip mounting part 12a may be a portion from the corner 5b to a second division line L2 which is disposed at a width or distance of X2 from the other corner 5b. X1 and X2 may have the same value.

The central portion CP1 of the semiconductor chip mounting part 12a may be a portion having a width or distance of X3 between the first division line L1 and the second division line L2. X3 may be less than X1 and/or X2. X3 may be 20% to 30% of X1 and/or X2. The central portion CP1 may be a portion between the first peripheral portion PP1 and the second peripheral portion PP2. The central portion CP1 may be a portion which is disposed over a certain distance from a central line of the semiconductor chip mounting part 12a.

The first connection pad 24, as described above in FIG. 1, may be installed on the first surface 1 of the board body 10. The first connection pad 24 may include a plurality of first ball land patterns 24a, which are separated from each other and disposed over a substantially entire portion of the semiconductor chip mounting part 12a. The first connection pad 24 may be formed of a metal layer, e.g., aluminum (Al) or a copper foil, and may be plated with, e.g., tin (Sb), gold (Au), nickel (Ni), or lead (Pb) at the metal layer. The first connection pad 24 may be connected to a connection terminal, for example, a bump, of the semiconductor chip.

A through hole for facilitating flow of the encapsulant in the process of molding the semiconductor chips mounted on the PCB 100 may not be formed in the semiconductor chip mounting part 12a. However, as described above referring to FIG. 1, the through region 14, which includes the plurality of through holes 14a passing through the board body 10, may be installed at the peripheral portion 13 of the semiconductor chip mounting region 12.

As described above, the through holes 14a according to the present example embodiments may not be formed in the semiconductor chip mounting part 12a. Because the through hole may not be formed in the semiconductor chip mounting part 12a, the first connection pad 24 may be arranged over a substantially entire portion of the semiconductor chip mounting part 12a. The arrangement of the first connection pad 24 may vary in the semiconductor chip mounting part 12a depending on a shape of a connection terminal of the semiconductor chip.

When the first connection pad 24 is disposed over a substantially entire portion of the semiconductor chip mounting part 12a, design flexibility of the semiconductor chip mounting part 12a in correspondence with a shape of the connection terminal of the semiconductor chip may be enhanced.

Figure 4A:
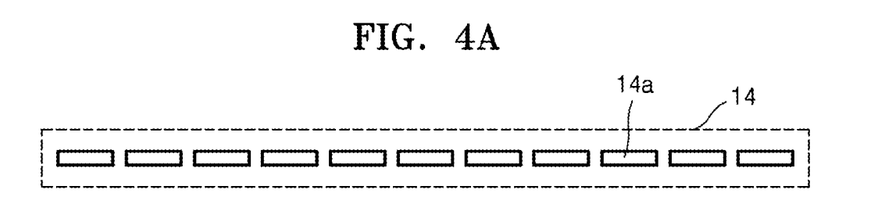
FIG. 4A is an upper plan view of a through region of the PCB of FIGS. 1 and 2.

FIG. 4A is an upper plan view of the through region of the PCB of FIGS. 1 and 2, and FIGS. 4B to 4E are upper plan views illustrating various modification examples of the through region of FIGS. 1 and 2.

As illustrated in FIG. 4A, the through holes 14a installed at the through region 14 may be tetragonal in shape, and for example, may have a rectangular shape. The through holes 14a may be arranged apart from each other.

Figure 4B:
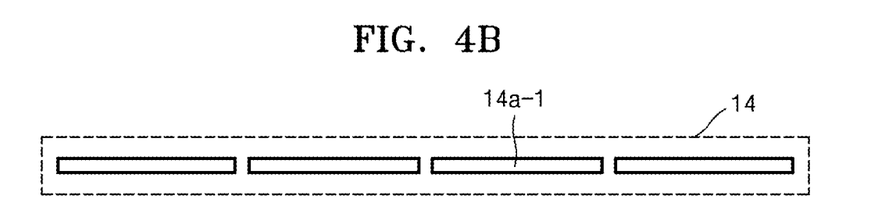
FIGS. 4B to 4E are upper plan views illustrating various modification examples of the through region of FIGS. 1 and 2.
Figure 4C:
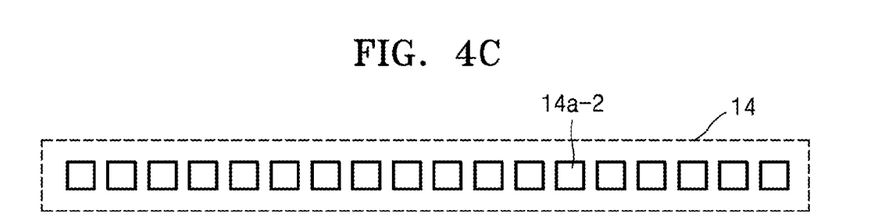

A through port 14a-1 of FIG. 4B may have a length longer than the through port 14a of FIG. 4A. Accordingly, the number of through holes 14a-1 of FIG. 4B may be less than the number of through holes 14a of FIG. 4A. In comparison with the through port 14a of FIG. 4A, a plurality of through holes 14a-2 of FIG. 4C may have a square shape.

Figure 4D:
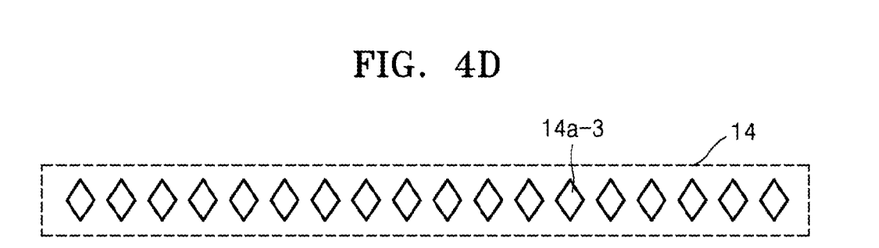
Figure 4E:
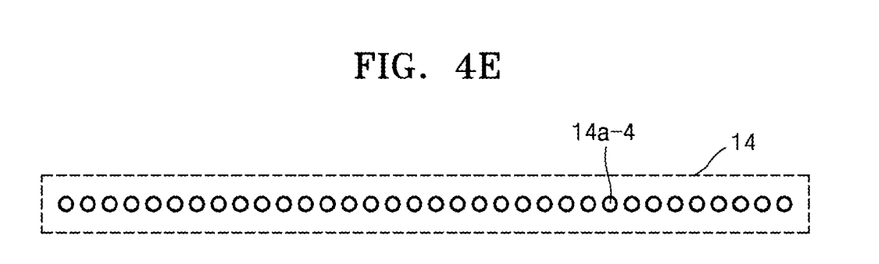

In comparison with the through port 14a of FIG. 4A, a plurality of through holes 14a-3 of FIG. 4D may have a diamond shape. In comparison with the through port 14a of FIG. 4A, a plurality of through holes 14a-4 of FIG. 4E may have a circular shape.

The number or separation distance of the through holes 14a, 14a-1, 14a-2, 14a-3 and 14a-4 may change depending on the case. The through holes 14a, 14a-1, 14a-2, 14a-3 and 14a-4 may have a polygonal shape, e.g., a pentagonal shape, other than the above-described triangular shape, diamond shape, and/or circular shape. The shapes of the through holes 14a, 14a-1, 14a-2, 14a-3 and 14a-4 are not limited to the above-described shapes.

Figure 5:
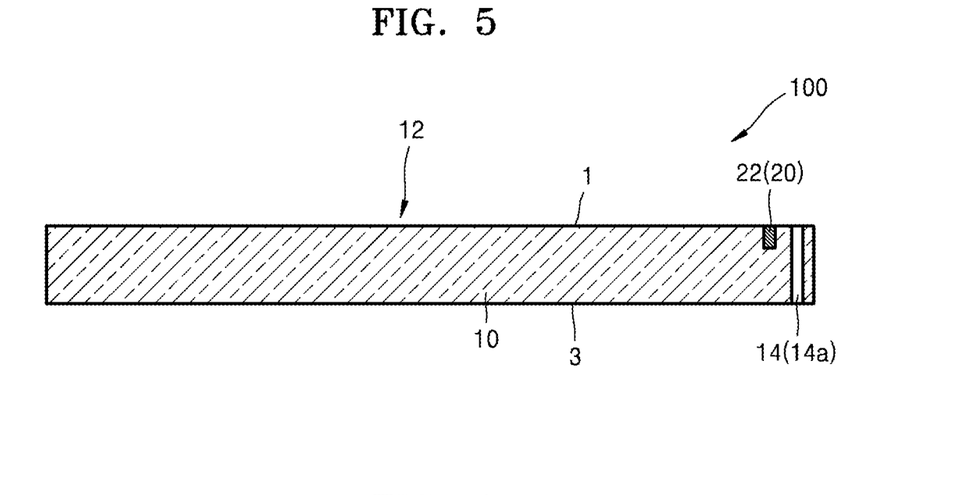
FIG. 5 is a cross-sectional view taken along a line V-V of FIG. 1.

FIG. 5 is a cross-sectional view taken along a line V-V of FIG. 1.

FIG. 5 is a view illustrating the display region 20 and the through region 14 of the PCB 100. As described above, the display region 20 may be disposed on the first surface 1 of the board body 10 and between the semiconductor chip mounting region 12 and the through region 14 of the PCB 100. The display region 20 may include the plurality of display patterns 22.

The through region 14 may be formed at the outermost portion 15 of the board body 10 outward from the display region 20. The through region 14 may include the through holes 14a passing through the board body 10. The through holes 14a, as described above, may have a polygonal shape, e.g., a triangular shape, a tetragonal shape, a diamond shape, or a circular shape.

Figure 6:
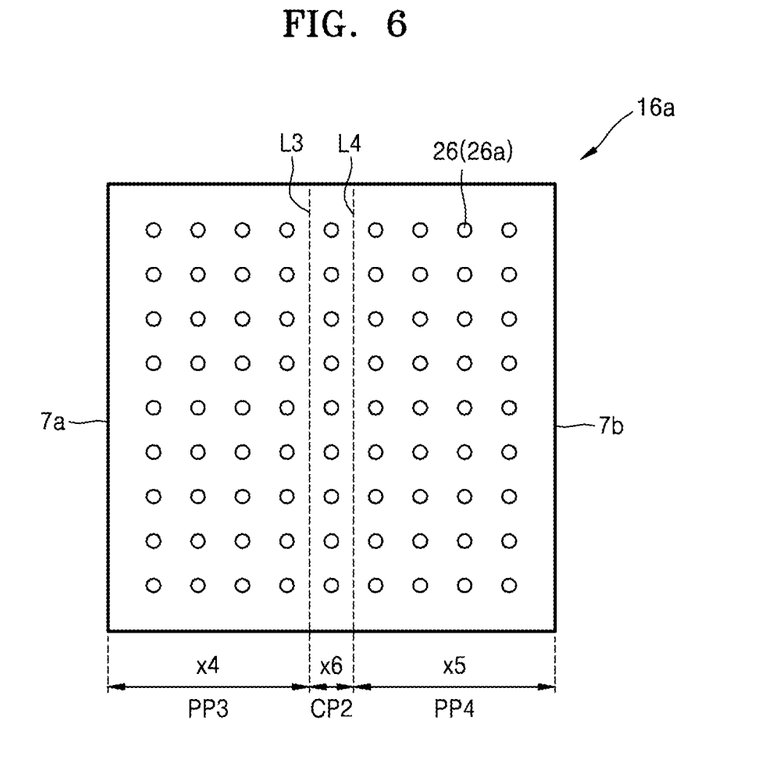
FIG. 6 is an upper plan view of an external terminal forming part configuring an external terminal forming region of the PCB of FIG. 2.

FIG. 6 is an upper plan view of the external terminal forming part included in the external terminal forming region of the PCB of FIG. 2.

FIG. 6 is an upper plan view which enlarges and illustrates one of the external terminal forming parts 16a of FIG. 2. A second connection pad 26, which is electrically connected to the semiconductor chip mounted on the top of the board body 10 of FIG. 1, may be disposed at the external terminal forming part 16a. The second connection pad 26 may be disposed at a central portion CP2 and peripheral portions PP3 and PP4 provided near the central portion CP2, of the external terminal forming part 16a.

The first peripheral portion PP3 of the external terminal forming part 16a may be a portion from one corner 7a to a first division line L3 that is disposed at a width or distance of X4 from the corner 7a. The second peripheral portion PP4 of the external terminal forming part 16a may be a portion from the corner 7b to a second division line L4 that is disposed at a width or distance of X5 from the other corner 7b. X4 and X5 may have the same value.

The central portion CP2 of the external terminal forming part 16a may be a portion having a width or distance of X6 between the first division line L3 and the second division line L4. X6 may be less than X4 and X5. X6 may be 20% to 30% of X4 and X5. The central portion CP2 may be a portion between the first peripheral portion PP3 and the second peripheral portion PP4. The central portion CP2 may be a portion which is disposed over a certain distance from a central line of the external terminal forming part 16a.

The second connection pad 26, as described above in FIG. 2, may be installed on the second surface 3 of the board body 10. The second connection pad 26 may include a plurality of second ball land patterns 26a, which are separated from each other over a substantially entire portion of the external terminal forming part 16a. The second connection pad 26 may be formed of the same material as the first connection pad 24. An external connection terminal capable of being connected to an external device may be disposed on the second connection pad 26.

As described above, a through hole may not be formed in the semiconductor chip mounting part 12a. Further, a through hole may not be formed in the external terminal forming part 16a. As described above in FIGS. 1 and 2, the through region 14, which includes the plurality of through holes 14a passing through the board body 10, may be installed at the peripheral portion 13 of the semiconductor chip mounting region 12.

As described above, because the through hole 14a according to may not be formed in the semiconductor chip mounting part 12a and the external terminal forming part 16a, the second connection pad 26 may be arranged over a substantially entire portion of the external terminal forming part 16a. The arrangement of the second connection pad 26 may vary in the external terminal forming part 16a depending on a shape of an external connection terminal. When the second connection pad 26 is arrange over a substantially entire portion of the external terminal forming part 16a, design flexibility of the external terminal forming part 16a in correspondence with a shape of an external device may be enhanced.

Figure 7:
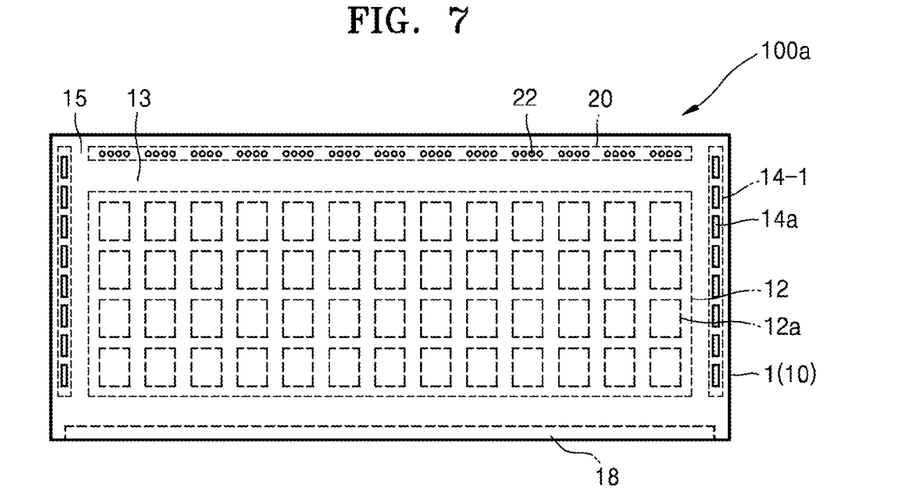
FIG. 7 is an upper plan view of a PCB according to example embodiments of the present invention.

FIG. 7 is an upper plan view of a PCB according to example embodiments of the present invention.

A PCB 100a of FIG. 7 is the same as the PCB 100 of FIGS. 1 and 2, except for a change in a location of the through region.

A through region 14-1 of the PCB 100a of FIG. 7 may be formed at a peripheral portion 13 at both sides of an encapsulant injecting port 18, instead of a side opposite to the encapsulant injecting port 18. The through region 14-1 may be formed at an outermost portion 15 of a board body 10 at both sides of the encapsulant injecting port 18. A shape of the through hole 14a formed at the through region 14-1 may have various shapes as described above, and thus a detailed description thereof will not be repeated here.

Figure 8:
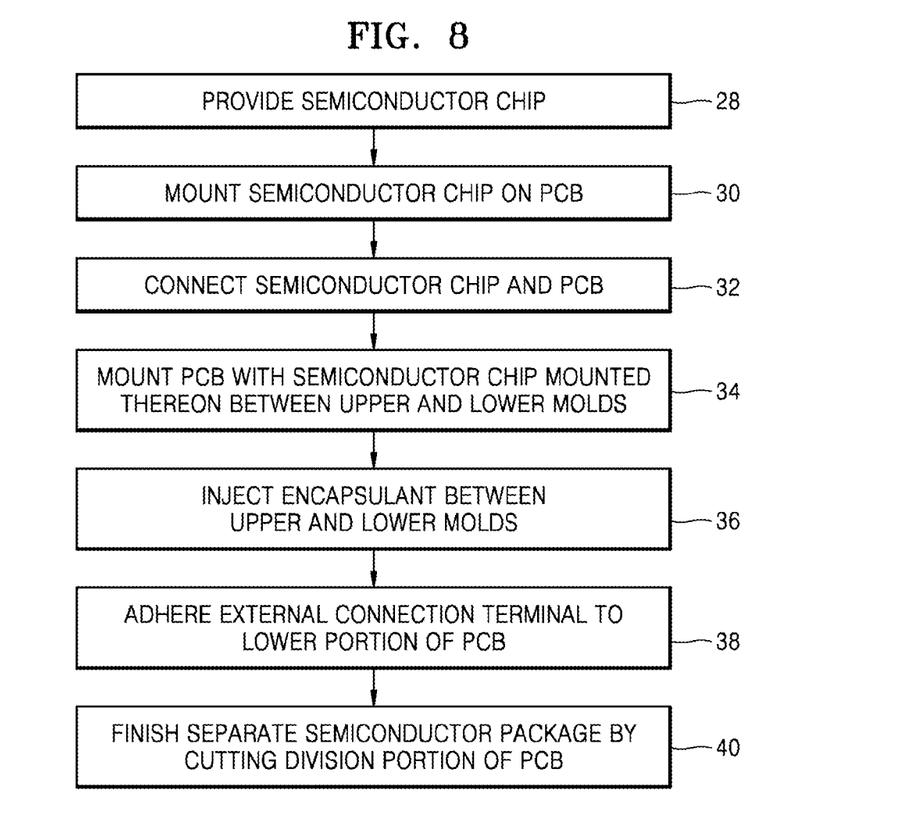
FIG. 8 is a flowchart describing a method of forming a semiconductor package using the PCB of FIGS. 1 and 2.
Figure 9:
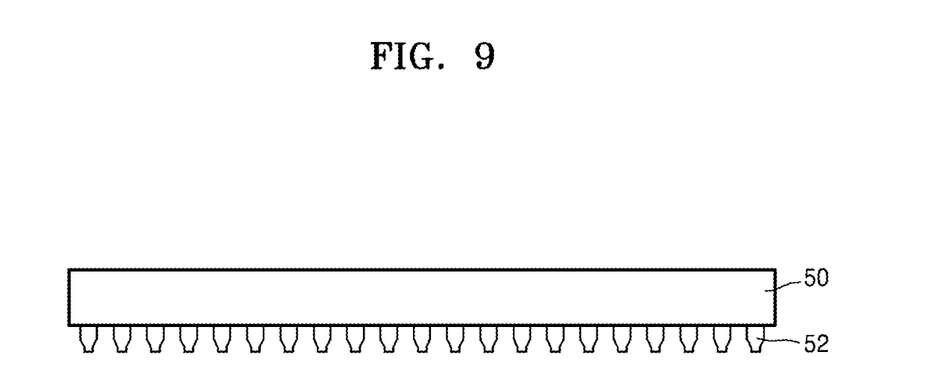
FIG. 9 is a cross-sectional view of a semiconductor chip used in the semiconductor package forming method of FIG. 8.

FIG. 8 is a flowchart describing a method of forming a semiconductor package using the PCB of FIGS. 1 and 2, and FIG. 9 is a cross-sectional view of a semiconductor chip used in the semiconductor package forming method of FIG. 8.

Referring to FIG. 9, a semiconductor chip 50 includes a connection terminal 52 (e.g., a bump). The semiconductor chip including the connection terminal 52 may be provided in operation 20. The semiconductor chip 50 may be a flip chip in which a side having an element forming region and the connection terminal 52 faces downward. The semiconductor chip 50 may be, e.g., a memory device, a logic device, a microprocessor, an analog device, a digital signal processor, or a system-on chip.

Because the through hole may not be formed at the semiconductor chip mounting part (12a in FIGS. 1 and 3) of the PCB (100 in FIG. 1) with the semiconductor chip 50 mounted thereon the connection terminal 52 may be variously arranged.

A plurality of the semiconductor chips 50 may be mounted on the PCB 100 in operation 30. The semiconductor chips 50 may be respectively mounted on the semiconductor chip mounting parts 12a of the PCB 100.

Figure 11:
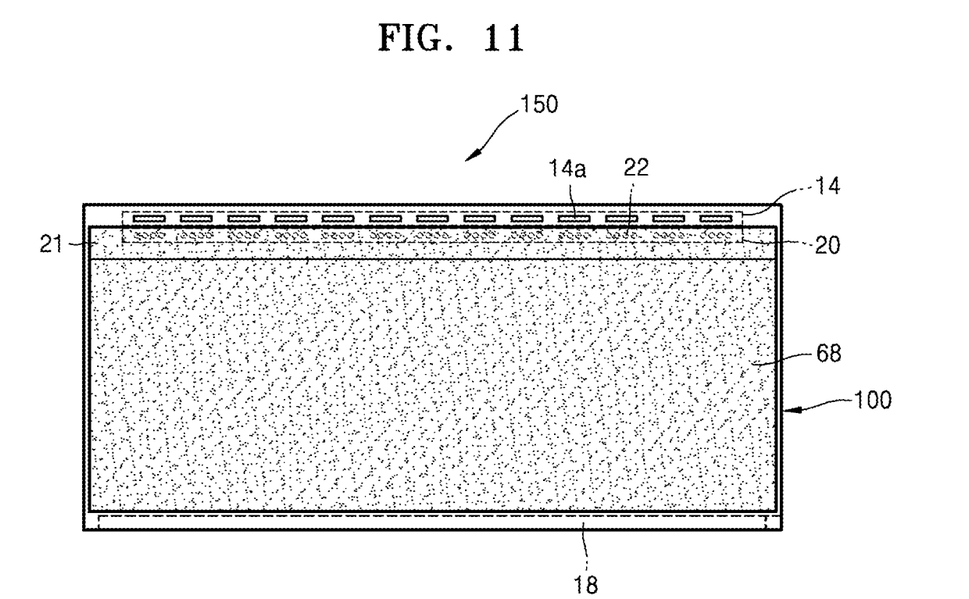
FIG. 11 is a plan view of an intermediate semiconductor package after the molding process in the semiconductor package forming method of FIG. 8 is performed.
Figure 12:
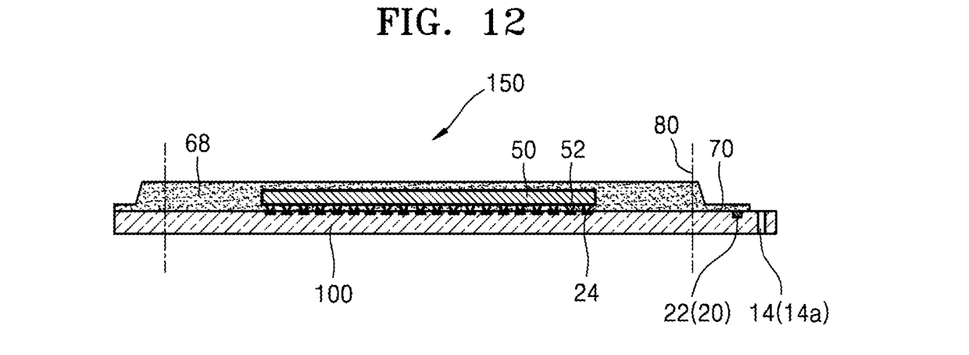
FIG. 12 is a cross-sectional view of the intermediate semiconductor package after the molding process in the semiconductor package forming method of FIG. 8 is performed.
Figure 13:
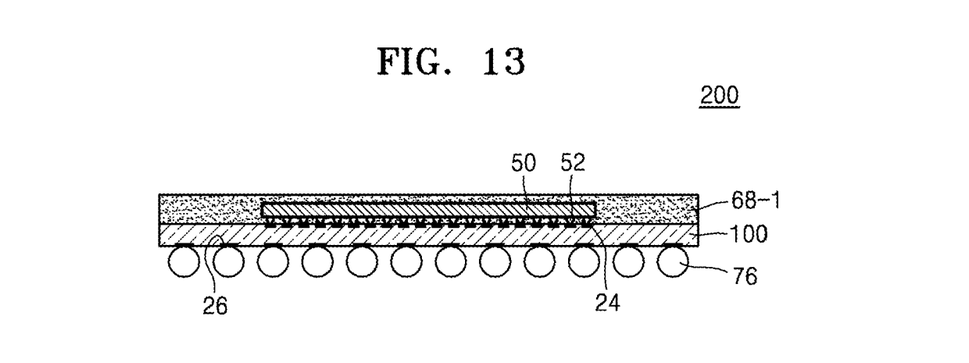
FIG. 13 is a cross-sectional view of a final semiconductor package formed by the semiconductor package forming method of FIG. 8.

The semiconductor chips 50 may be connected to the PCB 100 in operation 32. The connection terminals 52 of each of the semiconductor chips 50 may be respectively connected to the first connection pads (24 in FIG. 3) formed at each of the semiconductor chip mounting parts 12a of the PCB 100. A connection relationship between the connection terminals 52 of each of the semiconductor chips 50 and the first connection pads (24 in FIG. 3) of the PCB 100 is illustrated in FIGS. 11, 12 and 13. A connection between the semiconductor chips 50 and the PCB 100 may be made by heat-treating the PCB 100 with the semiconductor chips 50 mounted thereon.

Although operation 30 of mounting the semiconductor chips 50 and operation 32 of connecting the semiconductor chips 50 and the PCB 100 have been separately described, both of mounting the semiconductor chips 50 on the PCB 100 and connecting the connection terminals 52 of the semiconductor chips 50 to the first connection pads (24 in FIG. 3) of the PCB 100 may be achieved in one process. For example, the semiconductor chips 50 and the PCB 100 may be connected to each other when the semiconductor chips 50 are mounted on the PCB 100.

The PCB 100 with the semiconductor chips 50 mounted thereon may be disposed between an upper mold (60 in FIG. 10) and a lower mold (62 in FIG. 10) in operation 34. Subsequently, an encapsulating layer may be formed by injecting an encapsulant between the upper and lower molds 60 and 62 in operation 36. Operations 34 and 36 will be described in detail below.

An external connection terminal (76 in FIG. 13) may be adhered to a lower portion of the PCB 100 in operation 38. For example, the external connection terminal (76 in FIG. 13) may be adhered to the second connection pad 26 provided at the external terminal forming parts 16a of the second surface 3 of the PCB 100.

Referring to FIG. 13, the external connection terminal 76 may be, e.g., a solder ball. When a type of the semiconductor package 200 is a pin grid array (PGA) type, the external connection terminal 76 may be a pin instead of the solder.

Because the through hole may not be formed at the external terminal forming part 16a as described above, the second connection pad 26 may be disposed over a substantially entire portion of the external terminal forming part 16a, and thus, the external connection terminal (76 in FIG. 13) may be variously arranged.

Finally, an individual semiconductor package (200 in FIG. 13) may be formed by cutting a division portion (80 in FIG. 12) of the PCB 100 in operation 40. By cutting the PCB 100, finished semiconductor packages 200, each of which includes the semiconductor chips 50 mounted on the semiconductor chip mounting parts 12a, may be provided.

Figure 10:
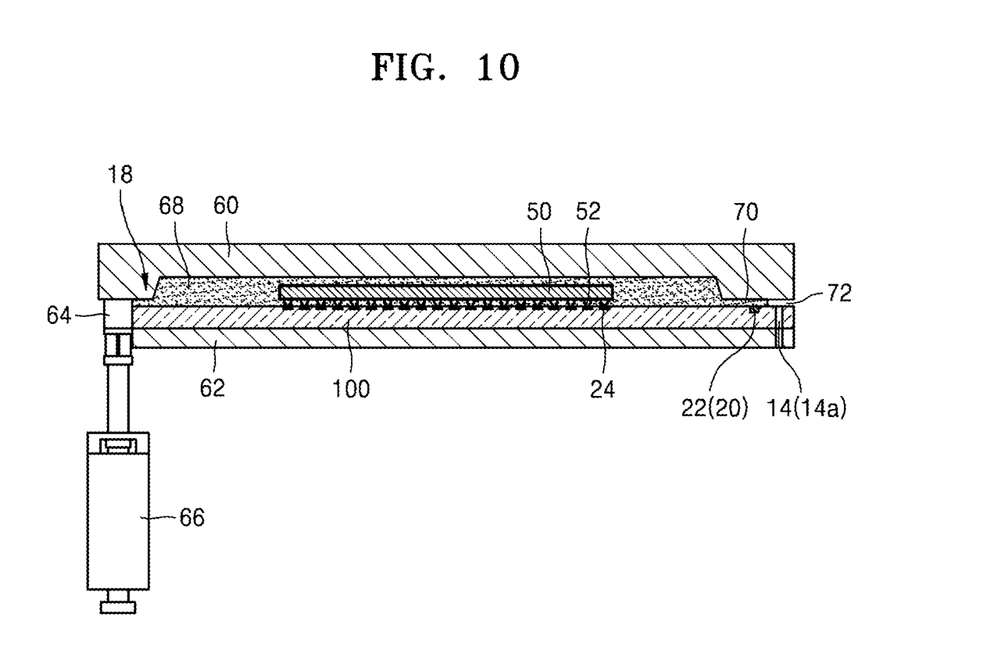
FIG. 10 is a detailed view illustrating a molding process in the semiconductor package forming method of FIG. 8.

FIG. 10 is a detailed view illustrating a molding process in the semiconductor package forming method of FIG. 8.

FIG. 10 is a view illustrating an operation of molding the PCB 100 of FIGS. 1 and 2. The semiconductor chips 50 may be mounted on the PCB 100 of FIG. 1, and then a molding process may be performed. Although a plurality of the semiconductor chips 50 may be mounted on the PCB 100, for convenience of explanation, a case in which one semiconductor chip 50 is mounted on the PCB 100 will now be described as an example of the molding process referring to FIG. 10.

In the molding process, the PCB 100 with the semiconductor chip 50 mounted thereon may be first disposed between the upper mold 60 and the lower mold 62. Subsequently, an encapsulating source 64 may be disposed at one side of the PCB 100, and an encapsulant injecting apparatus 66 may inject an encapsulant 68 into a cavity space between the upper mold 60 and the lower mold 62 through the encapsulant injecting port 18. The encapsulant 68 may be an epoxy mold compound (EMC). When the encapsulant 68 is injected into the cavity space, air may be absorbed through an air vent hole 72 disposed at the other side of the upper and lower molds 60 and 62 to flow the encapsulant 68 from the one side to the other side of the PCB 100. When the encapsulant 68 is being injected, flow of the encapsulant 68 may be impeded due to the semiconductor chip 50 and the connection terminal 52. When the flow of the encapsulant 68 deteriorates, a void may be formed in the encapsulant 68.

According to example embodiments, the injected encapsulant 68 may spread to cover up to an upper portion of the display region 20, for improving the flowability of the encapsulant 68. For example, when the encapsulant 68 spreads up to a dummy pocket region 70 corresponding to the display region 20, at which flow the encapsulant 68 may be enhanced. Thus, a void may be reduced or prevented from being formed in the encapsulant 68. The dummy pocket region 70 may be a region disposed at one side of the cavity space. When the dummy pocket region 70 is formed to be longer and broader, a void may be more easily reduced or prevented from being formed in the encapsulant 68.

When the encapsulant 68 covers the upper portion of the display region 20, the display patterns 22 that display the quality status of semiconductor chips by using the vision camera in the marking process of the semiconductor package manufacturing process cannot be inspected. However, the quality status of the semiconductor chip 50 mounted on the PCB 100 may be generated as map data by using a separate device, and the map data may be transmitted to marking equipment, thereby solving the inspection limitation.

According to example embodiments, in order to improve the flow of the encapsulant 68, the through hole may not be formed in the semiconductor chip mounting part 12a of the PCB 100, and the through region 14 including the plurality of through holes 14a may be installed at the outermost portion 15 of the PCB 100. A mold through port may also be formed at the lower mold 62 in correspondence with the through holes 14a of the PCB 100.

When the through holes 14a are formed at the outermost portion 15 of the PCB 100, air may be absorbed through the through holes 14a in addition to the air vent hole 72 disposed at the other side of the upper and lower molds 60 and 62. Accordingly, the encapsulant 68 may flow better from one side to the other of the PCB 100.

Through the molding process, the encapsulant 68 may seal the top surface of the PCB 100, e.g., the first surface 1 of the board body 10, and the semiconductor chip 50 including the connection terminal 52.

For example, the encapsulant 68 may be a molded underfill (MUF) encapsulant that fills a space between the semiconductor chip 50 and the PCB 100 and further seals the semiconductor package (200 in FIG. 13).

In the event that the MUF encapsulant is used as an encapsulant, the molding process may not only seal the semiconductor package, but also fills the space between the semiconductor chip 50 and the PCB 100. Thus, if a reliable MUF encapsulant, e.g., EMC, is used, the molding process can be simplified because a separate underfill process may not be necessary.

FIG. 11 is a plan view of an intermediate semiconductor package after the molding process in the semiconductor package forming method of FIG. 8 is performed, and FIG. 12 is a cross-sectional view of the intermediate semiconductor package after the molding process in the semiconductor package forming method of FIG. 8 is performed.

FIGS. 11 and 12 are views illustrating the intermediate semiconductor package 150 after the molding process of FIG. 10 is performed.

As illustrated in FIGS. 11 and 12, the encapsulant 68, which is injected through the encapsulant injecting port 18 disposed at one side of the PCB 100, may be formed to cover the upper portion of the display region 20. As described above, when the encapsulant 68 covers up to the upper portion of the display region 20 during the injection of the encapsulant 68, flow of the encapsulant 68 may be improved, thereby reducing or preventing a void from being formed. In FIG. 11, a region referred to by reference numeral 21 is an enlarged encapsulant region which is formed by spreading the encapsulant 68. In FIG. 11, the display region 20 is illustrated for convenience of description, although it cannot be seen from above because the encapsulant 68 covers the display region 20.

FIG. 13 is a cross-sectional view of a final semiconductor package formed by the semiconductor package forming method of FIG. 8.

A final semiconductor package 200 formed by the semiconductor package forming method of example embodiments (e.g., an individual package) includes the PCB 100.

The PCB 100, as described above in FIGS. 1 and 2, may include the board body 10 that includes the first surface 1 and the second surface 3 opposite thereto. The PCB 100, as described above in FIGS. 1 and 3, may include the semiconductor chip mounting part 12a disposed on the first surface 1 of the board body 10, and the first connection pad 24 disposed at a central portion CP1 and peripheral portion PP1 and PP2, which is provided near the central portion CP, of the semiconductor chip mounting part 12a.

The semiconductor chip 50 connected to the first connection pad 24 may be mounted on the semiconductor chip mounting part 12a of FIGS. 1 and 3. The semiconductor chip 50 may be flipped. The connection terminal 52 of the semiconductor chip 50 may be connected to the first connection pad 24. The first connection pad 24, as described above in FIG. 3, may include the plurality of first ball land patterns 24a which are separated from each other and disposed over substantially entire portion of the semiconductor chip mounting part 12a disposed on the first surface 1 of the board body 10.

As described above, because the through hole may not be formed at the central portion CP of the semiconductor chip mounting part 12a, the first connection pad 24 may be variously arranged, thereby enhancing design flexibility.

The final semiconductor package 200 may include an encapsulating layer 68-1 that seals the top surface of the PCB 100, e.g., the first surface 1 of the board body 10 of FIG. 1, and the semiconductor chip 50 including the connection terminal 52. The encapsulating layer 68-1, as described above, may be formed by injecting the encapsulant 68 during the molding process. A void, as described above, may be reduced or prevented from being formed in the encapsulating layer 68-1.

The final semiconductor package 200 may include the second connection pad 26 which is disposed at the external terminal forming part disposed at the bottom surface of the PCB 100, namely, at the bottom of the board body 10 of FIG. 3. The second connection pad 26, as illustrated in FIG. 6, may be disposed at a central portion CP2 and peripheral portion PP3 and PP4 provided near the central portion CP of the external terminal forming part 16a. The second connection pad 26, as described above in FIG. 6, may include the plurality of second ball land patterns 26a which are separated from each other and disposed over substantially entire portion of the external terminal forming part 16a.

The final semiconductor package 200 may include the external connection terminal 76, which is disposed on the second connection pad 26 and connected to an external device. The external connection terminal 76 may be a solder ball. As described above, because the through hole may not be formed at the central portion CP of the external terminal forming part 16a, the external connection terminal 76 may be disposed at the central portion CP of the external terminal forming part 16a. Accordingly, the external connection terminal 76 may be variously arranged, thereby enhancing design flexibility.

Figure 14:
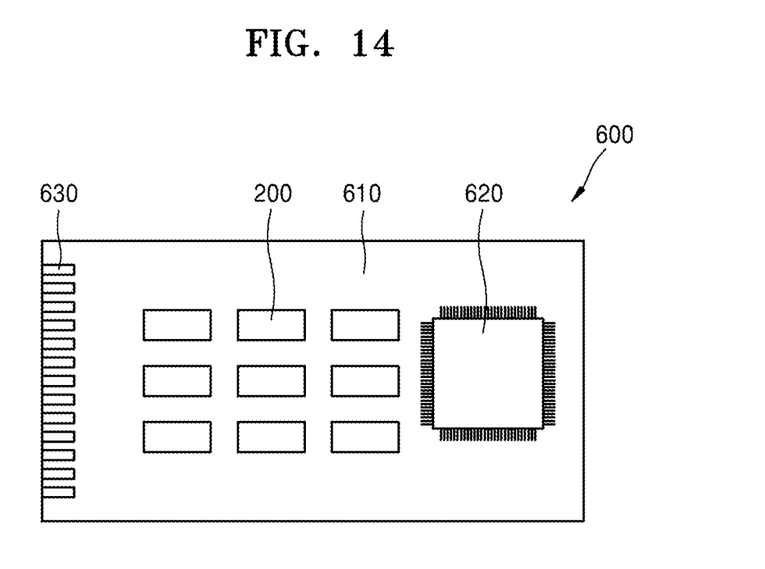
FIG. 14 is a schematic view illustrating a configuration of a package module using the semiconductor package according to example embodiments of the present invention.

FIG. 14 is a schematic view illustrating a configuration of a package module using the semiconductor package according to example embodiments of the present invention.

The final semiconductor package 200 according to the example embodiments may be applied to a package module 600. The package module 600 may include a module board 610 to which a plurality of the semiconductor packages 200 are adhered. The package module 600 may include a control semiconductor package 620, for instance, at one side of the package module 600, and an external connection terminal 630 may be disposed at the other side of the package module 600. The final semiconductor package 200 according to the example embodiments is not limited to that of FIG. 14, and may be applied to various package modules 600.

Figure 15:
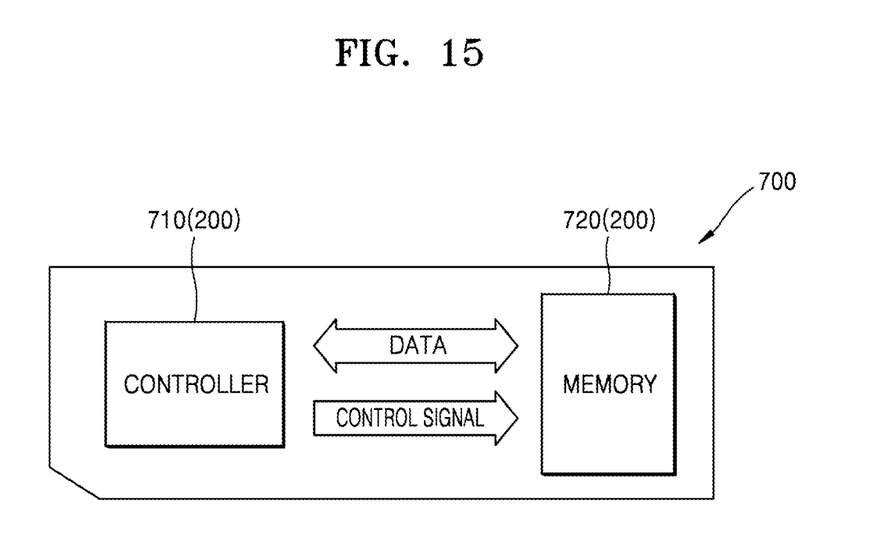
FIG. 15 is a schematic view illustrating a configuration of a card using the semiconductor package according to example embodiments of the present invention.

FIG. 15 is a schematic view illustrating a configuration of a card using the semiconductor package according to example embodiments of the present invention.

The semiconductor package 200 according to the example embodiments may be applied to a card 700. The card 700 may include a multimedia card (MMC), a secure digital card (SD), etc. The card 700 may include a controller 710 and a memory 720. The memory 720 may be, e.g., a flash memory, a random access memory (RAM), a phase change RAM (PRAM), or another type of a nonvolatile memory. The controller 710 may transfer a control signal to the memory 720, and data may be exchanged between the controller 710 and the memory 720.

The above-described semiconductor package 200 of the example embodiments may be applied to the controller 710 and the memory 720 that configure the card 700 of the example embodiments. In this case, the card 700 may include the memory 720 having a large capacity and the controller 710 that is multi-functional. Also, the card 700 of the example embodiments can be made this and have a short interconnection length, thereby enhancing a performance.

Figure 16:
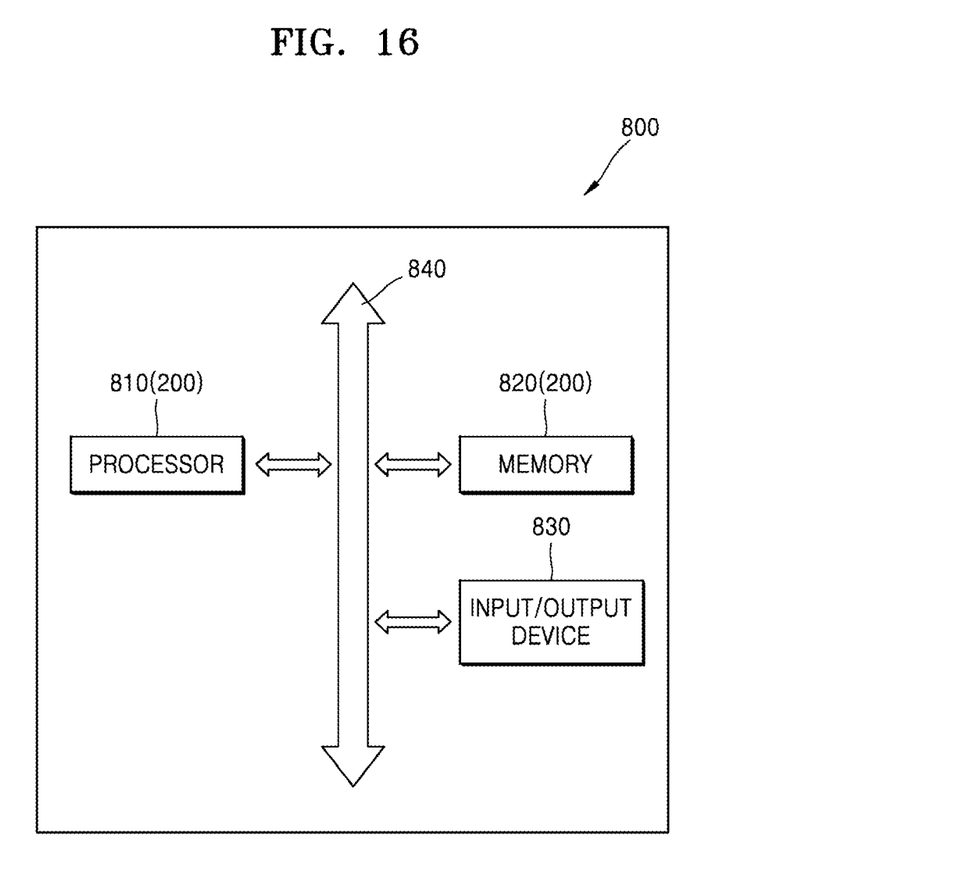
FIG. 16 is a schematic view illustrating a configuration of an electronic system using the semiconductor package according to example embodiments of the present invention.

FIG. 16 is a schematic view illustrating a configuration of an electronic system using the semiconductor package according to the example embodiments.

An electronic system 800 according to the example embodiments may be, e.g., a computer, a mobile phone, an MPEG audio layer-3 (MP3) player, or a navigator. The electronic system 800 according to the example embodiments may include a processor 810, a memory 820, and an input/output device 830. A control signal or data may be exchanged between the processor 810 and the memory 820 or input/output device 830 through a communication channel 840.

In the electronic system 800 according to the example embodiments, the semiconductor package 200 may be applied to the processor 810 and/or the memory 820. In this case, the electronic system 800 according to the example embodiments may realize multi functions, and/or enhance reliability.

In the PCB according to the example embodiments, the through hole may not be formed in the semiconductor chip mounting part, but the through region including the plurality of through holes may be formed at the peripheral portion of the semiconductor chip mounting region.

The PCB according to the example embodiments may include the through region, and thus can reduce or prevent a void from being formed in the encapsulating layer in a process of molding semiconductor chips mounted on the PCB.

In the PCB according to the example embodiments, because the through hole may not be formed at the semiconductor chip mounting part, design flexibility with respect to the first and second connection pads respectively disposed at the top and the bottom may be enhanced.

Because the semiconductor package according to the example embodiments may use the PCB in which the through hole is not formed in the semiconductor chip mounting part, design flexibility with respect to the external connection terminal formed at the bottom of the PCB may be enhanced.

While example embodiments have been particularly shown and described with reference to some example embodiments, it will be understood by those of ordinary skill in the art that various changes in form and details may be made therein without departing from the spirit and scope of example embodiments as defined by the following claims.

What is claimed is:

1. A printed circuit board (PCB) comprising:
    a board body having a first surface and a second surface opposite to the first surface;
    a semiconductor chip mounting region on the first surface of the board body, and including a plurality of semiconductor chip mounting parts on which a plurality of semiconductor chips are to be mounted;
    at least one through region at at least one first peripheral portion outside the semiconductor chip mounting region, and including a plurality of through holes passing through the board body;
    a display region on the first surface of the board body, the display region being between the semiconductor chip mounting region and the at least one through region, the display region configured to passively indicate a quality status of the semiconductor chip;
    an external terminal forming region on the second surface of the board body, the external terminal forming region including a plurality of external terminal forming parts provided corresponding to the respective semiconductor chip mounting parts; and
    a single elongated encapsulant injecting port at a second peripheral portion outside the semiconductor chip mounting region.

2. The PCB of claim 1, further comprising:
    a plurality of first connection pads at a central portion and at least one peripheral portion adjacent to the central portion of each of the semiconductor chip mounting parts, the first connection pads configured to mount a corresponding one of the semiconductor chips thereon.

3. The PCB of claim 2, wherein the first connection pads comprises a plurality of first ball land patterns, the first ball land patterns separated from each other and provided over a substantially entire portion of each of semiconductor chip mounting parts.

4. The PCB of claim 1, wherein the at least one through region is at at least one outermost portion of the board body.

5. The PCB of claim 1, wherein the at least one through region is opposite to the elongated encapsulant injecting port.

6. The PCB of claim 1, wherein the through holes are separated from each other and have at least one of a circular shape and a polygonal shape.

7. The PCB of claim 1, further comprising:
    a plurality of second connection pads at a central portion and at least one peripheral portion adjacent to the central portion of each of the external terminal forming parts, the second connection pads configured to be electrically connected to a corresponding one of the semiconductor chips.

8. The PCB of claim 7, wherein the second connection pads comprises a plurality of second ball land patterns, the second ball land patterns separated from each other and arranged over a substantially entire portion of each of the external terminal forming parts.

9. The PCB of claim 1, wherein the at least one through region is at an outermost portion of the board body that is outward from the display region.

10. The PCB of claim 1, wherein the second peripheral portion is opposite to the first peripheral portion with respect to the semiconductor chip mounting region.

11. The PCB of claim 1, wherein the second peripheral portion is provided at an end of the first peripheral portion to be perpendicular thereto.

12. The PCB of claim 1, wherein:
the at least one through region includes a first through region and a second through region;
the at least one first peripheral portion includes a first side peripheral portion and a second side peripheral portion;
the first and second through regions are at the first and second side peripheral portions, respectively; and
the first and second side peripheral portions are provided at opposite ends of the second peripheral portion to be perpendicular thereto.

13. A printed circuit board (PCB) comprising:
a board body including a top surface and a bottom surface;
a semiconductor chip mounting region on the top surface of the board body, the semiconductor chip mounting region including a plurality of semiconductor chip mounting parts configured to mount a plurality of semiconductor chips thereon;
at least one through region at a first peripheral portion outside the semiconductor chip mounting region and including a plurality of through holes passing through the board body;
a display region on the top surface of the board body, the display region being between the semiconductor chip mounting region and the at least one through region, the display region configured to passively indicate a quality status of the semiconductor chip;
an external terminal forming region on the bottom surface of the board body, the external terminal forming region including a plurality of external terminal forming parts, the external terminal forming parts corresponding to the respective semiconductor chip mounting parts; and
a single elongated encapsulant injecting port at a second peripheral portion outside the semiconductor chip mounting region.

14. The PCB of claim 13, wherein the at least one through region is at least one outermost portion of the board body.

15. The PCB of claim 13, wherein the at least one through region is opposite to the single elongated encapsulant injecting port with respect to the semiconductor chip mounting region.

16. The PCB of claim 13, wherein the at least one through region is in a first direction, the first direction being perpendicular to a second direction defined between the display region and the single elongated encapsulant injection port.

17. The PCB of claim 13, wherein the at least one through region is not on the semiconductor chip mounting parts and the external terminal forming parts such that a plurality of first ball land patterns are over a substantially entire portion of each of the semiconductor chip mounting parts and a plurality of second ball land patterns are over a substantially entire portion of each of the external terminal forming parts.

18. The PCB of claim 13, wherein the second peripheral portion is opposite to the first peripheral portion with respect to the semiconductor chip mounting region.

19. The PCB of claim 13, wherein the second peripheral portion is at an end of the first peripheral portion to be perpendicular thereto.

20. The PCB of claim 13, wherein:
the at least one through region includes a first through region and a second through region;
the at least one first peripheral portion includes a first side peripheral portion and a second side peripheral portion;
the first and second through regions are at the first and second side peripheral portions, respectively; and
the first and second side through regions are provided at opposite ends of the single elongated encapsulant injecting port to be perpendicular thereto.

* * * * *